US010305497B2

(12) United States Patent
Nakata

(10) Patent No.: US 10,305,497 B2
(45) Date of Patent: May 28, 2019

(54) SEMICONDUCTOR INTEGRATED CIRCUIT, DLL CIRCUIT, AND DUTY CYCLE CORRECTION CIRCUIT

(71) Applicant: Toshiba Memory Corporation, Minato-ku (JP)

(72) Inventor: Masashi Nakata, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/916,703

(22) Filed: Mar. 9, 2018

(65) Prior Publication Data

US 2019/0081631 A1    Mar. 14, 2019

(30) Foreign Application Priority Data

Sep. 11, 2017    (JP) ................................. 2017-174379

(51) Int. Cl.
| | | |
|---|---|---|
| *H03L 7/087* | (2006.01) | |
| *H03L 7/081* | (2006.01) | |
| *G11C 7/22* | (2006.01) | |

(52) U.S. Cl.
CPC .............. *H03L 7/087* (2013.01); *G11C 7/222* (2013.01); *H03L 7/0816* (2013.01)

(58) Field of Classification Search
CPC ..... H03L 7/087; H03L 7/0812; H03L 7/0816; H03L 7/083; H03L 7/10
USPC ........................................ 327/156, 158, 161
See application file for complete search history.

(56) References Cited

U.S. PATENT DOCUMENTS

| | | | | |
|---|---|---|---|---|
| 6,035,409 | A | * | 3/2000 | Gaudet ................. H04L 7/0337 713/401 |
| 7,239,189 | B2 | | 7/2007 | Takayama |
| 8,542,552 | B2 | | 9/2013 | Aoki |

FOREIGN PATENT DOCUMENTS

| | | |
|---|---|---|
| JP | 2000-59183 | 2/2000 |
| JP | 2004-80155 | 3/2004 |
| JP | 2006-67190 | 3/2006 |
| JP | 2013-70281 | 4/2013 |

* cited by examiner

*Primary Examiner* — John W Poos
(74) *Attorney, Agent, or Firm* — Oblon, McClelland, Maier & Neustadt, L.L.P.

(57) ABSTRACT

According to one embodiment, in a semiconductor integrated circuit of a DLL circuit, in a delay chain, a plurality of delay elements are connected. A first detection circuit detects a group corresponding to a certain delay amount among a plurality of groups obtained by dividing the delay chain. A second detection circuit detects a delay element corresponding to the certain delay amount among a plurality of delay elements included in the detected group. The semiconductor integrated circuit detects the number of delay elements corresponding to one cycle of a first clock. The control circuit includes a second delay chain. The second delay chain has a configuration equivalent to the delay chain in the semiconductor integrated circuit. The control circuit outputs a second clock obtained by delaying the first clock by using the second delay chain according to the number of delay elements detected by the semiconductor integrated circuit.

18 Claims, 13 Drawing Sheets

FIG.6A

| EXAMPLE OF qr (IN CASE OF m = 8) | ROW NUMBER |
|---|---|
| 0000_0000 | 0 |
| 0000_0001 | 1 |
| 0000_0011 | 2 |
| 0000_0111 | 3 |
| 0000_1111 | 4 |
| 0001_1111 | 5 |
| 0011_1111 | 6 |
| 0111_1111 | 7 |
| 1111_1111 | 8 |

FIG.6B

| EXAMPLE OF qc (IN CASE OF n = 8) | COLUMN NUMBER |
|---|---|
| 000_0000 | 0 |
| 000_0001 | 1 |
| 000_0011 | 2 |
| 000_0111 | 3 |
| 000_1111 | 4 |
| 001_1111 | 5 |
| 011_1111 | 6 |
| 111_1111 | 7 |

FIG.11A

| qrcnt0 | qrcnt1 | selc | ROW NUMBER |
|---|---|---|---|
| 0 | 0 | 0 | 0 |
| 1 | 0 | 1 | 1 |
| 1 | 1 | 0 | 2 |
| 2 | 1 | 1 | 3 |
| 2 | 2 | 0 | 4 |
| 3 | 2 | 1 | 5 |
| 3 | 3 | 0 | 6 |
| 4 | 3 | 1 | 7 |
| 4 | 4 | 0 | 8 |
| ... | | | |

FIG.11B

| EXAMPLE OF qc (IN CASE OF n = 8) | COLUMN NUMBER |
|---|---|
| 000_0000 | 0 |
| 000_0001 | 1 |
| 000_0011 | 2 |
| 000_0111 | 3 |
| 000_1110 | 4 |
| 001_1100 | 5 |
| 011_1000 | 6 |
| 111_0000 | 7 |

SEMICONDUCTOR INTEGRATED CIRCUIT, DLL CIRCUIT, AND DUTY CYCLE CORRECTION CIRCUIT

CROSS-REFERENCE TO RELATED APPLICATIONS

This application is based upon and claims the benefit of priority from Japanese Patent Application No. 2017-174379, filed on Sep. 11, 2017; the entire contents of which are incorporated herein by reference.

FIELD

Embodiments described herein relate generally to a semiconductor integrated circuit, a DLL circuit, and a duty cycle correction circuit.

BACKGROUND

A circuit having a plurality of delay elements can generate a certain delay amount by using some delay elements among the plurality of delay elements. At this time, it is desired to efficiently specify the number of delay element stages corresponding to the certain delay amount.

BRIEF DESCRIPTION OF THE DRAWINGS

FIGS. 6A and 6B are diagrams illustrating detection results of a delay time detection circuit including the semiconductor integrated circuit according to the first embodiment;

FIGS. 11A and 11B are diagrams illustrating detection results of a delay time detection circuit including the semiconductor integrated circuit according to the second embodiment;

DETAILED DESCRIPTION

In general, according to one embodiment, there is provided a DLL circuit including a semiconductor integrated circuit and a control circuit. The semiconductor integrated circuit includes a delay chain, a first detection circuit, and a second detection circuit. In the delay chain, a plurality of delay elements are connected. The first detection circuit detects a group corresponding to a certain delay amount among a plurality of groups obtained by dividing the delay chain. The second detection circuit detects a delay element corresponding to the certain delay amount among the plurality of delay elements included in the detected group. The semiconductor integrated circuit detects the number of delay elements corresponding to one cycle of a first clock. The control circuit includes a second delay chain. The second delay chain has a configuration equivalent to the delay chain in the semiconductor integrated circuit. The control circuit outputs a second clock obtained by delaying the first clock by using the second delay chain according to the number of delay elements detected by the semiconductor integrated circuit.

Exemplary embodiments of a semiconductor integrated circuit will be explained below in detail with reference to the accompanying drawings. The present invention is not limited to the following embodiments.

First Embodiment

A DLL circuit 1 including semiconductor integrated circuit 100 according to a first embodiment will be described. The DLL circuit 1 receives a reference clock from an outside (for example, a host), performs locking in a state where a delay amount applied to the reference clock has reached a certain delay amount, and outputs an output clock having the certain delay amount applied to the reference clock to a circuit (for example, an internal circuit) in the subsequent stage. Since the DLL circuit 1 can be used for a high-speed I/F circuit such as a host I/F circuit in a NAND type flash memory, the DLL circuit 1 is required to perform locking at a high speed.

Figure 1:
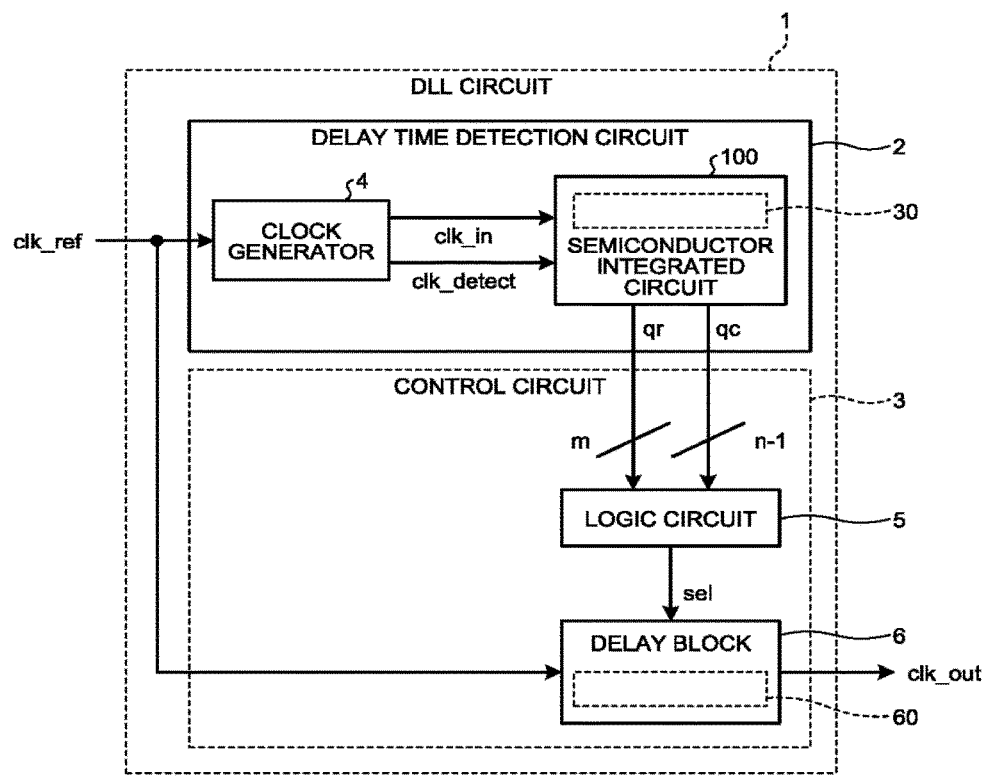
FIG. 1 is a circuit diagram illustrating a configuration of a DLL circuit including a semiconductor integrated circuit according to a first embodiment.

For example, the DLL circuit 1 is configured as illustrated in FIG. 1. FIG. 1 is a block diagram illustrating a configuration of the DLL circuit 1. The DLL circuit 1 is a DLL circuit capable of performing locking at a high speed on the basis of a time-to-digital converter (TDC) technology. The DLL circuit 1 includes a delay time detection circuit 2 and a control circuit 3. The delay time detection circuit 2 includes a clock generator 4 and a semiconductor integrated circuit 100. The semiconductor integrated circuit 100 includes a delay chain 30. The delay chain 30 includes a plurality of delay elements and is configured by connecting the plurality of delay elements. The control circuit 3 includes a logic circuit 5 and a delay block 6. The delay block 6 includes a delay chain (second delay chain) 60. The delay chain 60 has a configuration equivalent to the delay chain 30 in the semiconductor integrated circuit 100 and has a configuration where the plurality of delay elements are connected.

Figure 2:
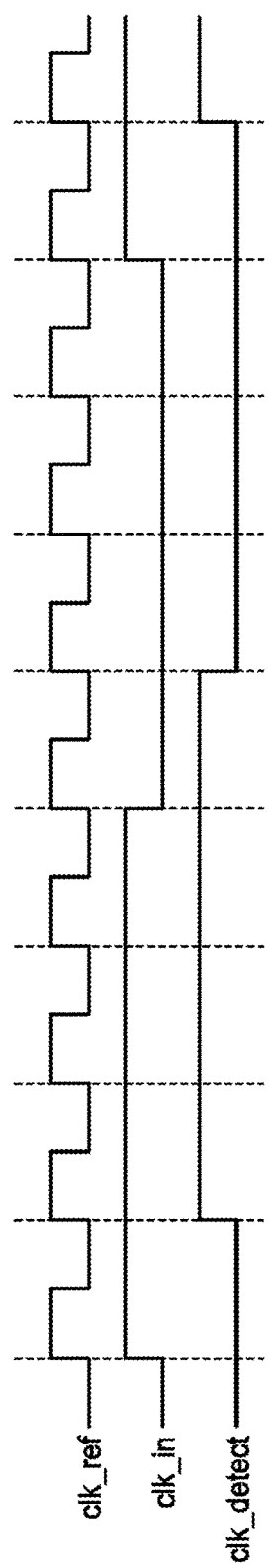
FIG. 2 is a waveform diagram illustrating operations of a clock generator in the first embodiment.

The clock generator 4 receives a reference clock clk_ref and generates, by using the reference clock clk_ref, clocks clk_in and clk_detect for internal operation as illustrated in FIG. 2. FIG. 2 is a waveform diagram illustrating operations of the clock generator 4. For example, the clock generator 4 generates the clock clk_in by dividing the reference clock clk_ref by 4 in synchronization with a rising edge of the reference clock clk_ref. In synchronization with the rising edge of the reference clock clk_ref, the clock generator 4 generates the clock clk_detect by delaying the clock clk_in by one cycle of the reference clock clk_ref. The clock clk_detect can be regarded as a clock for detecting a delay of one cycle. The clock generator 4 supplies the generated clock clk_in and the generated clock clk_detect to the semiconductor integrated circuit 100.

For example, the case is considered where the semiconductor integrate circuit 100 is configured such that a phase comparator is provided for each delay element in the delay chain 30, and phase comparison between an output of the delay element and a reference clock clk_ref corresponding to the certain delay amount is performed by each phase comparator. In this case, the first rising edge of the reference clock clk_ref sequentially passes through the plurality of delay elements, and the output of each phase comparator is taken in at the second rising edge. By counting the number of H level within the output results of the plurality of phase comparators, the number of delay element stages corresponding to one cycle can be found. Based on the result, it is possible to calculate and output the number of delay element stages of an arbitrary phase angle (90° or 180°). In the configuration, one phase comparator is required for one delay element, and thus, the circuit scale of the DLL circuit 1 tends to be large. As a result, leakage current and power consumption of the DLL circuit 1 tend to be large, and the layout area of the DLL circuit 1 tends to increase.

Therefore, in the first embodiment, a plurality of delay elements included in the delay chain 30 are grouped, and the detection of the number of delay element stages in the semiconductor integrated circuit 100 is performed by two stages of specifying the group and specifying the elements in the group, so that the number of phase comparators required for detection can be reduced.

Figure 3:
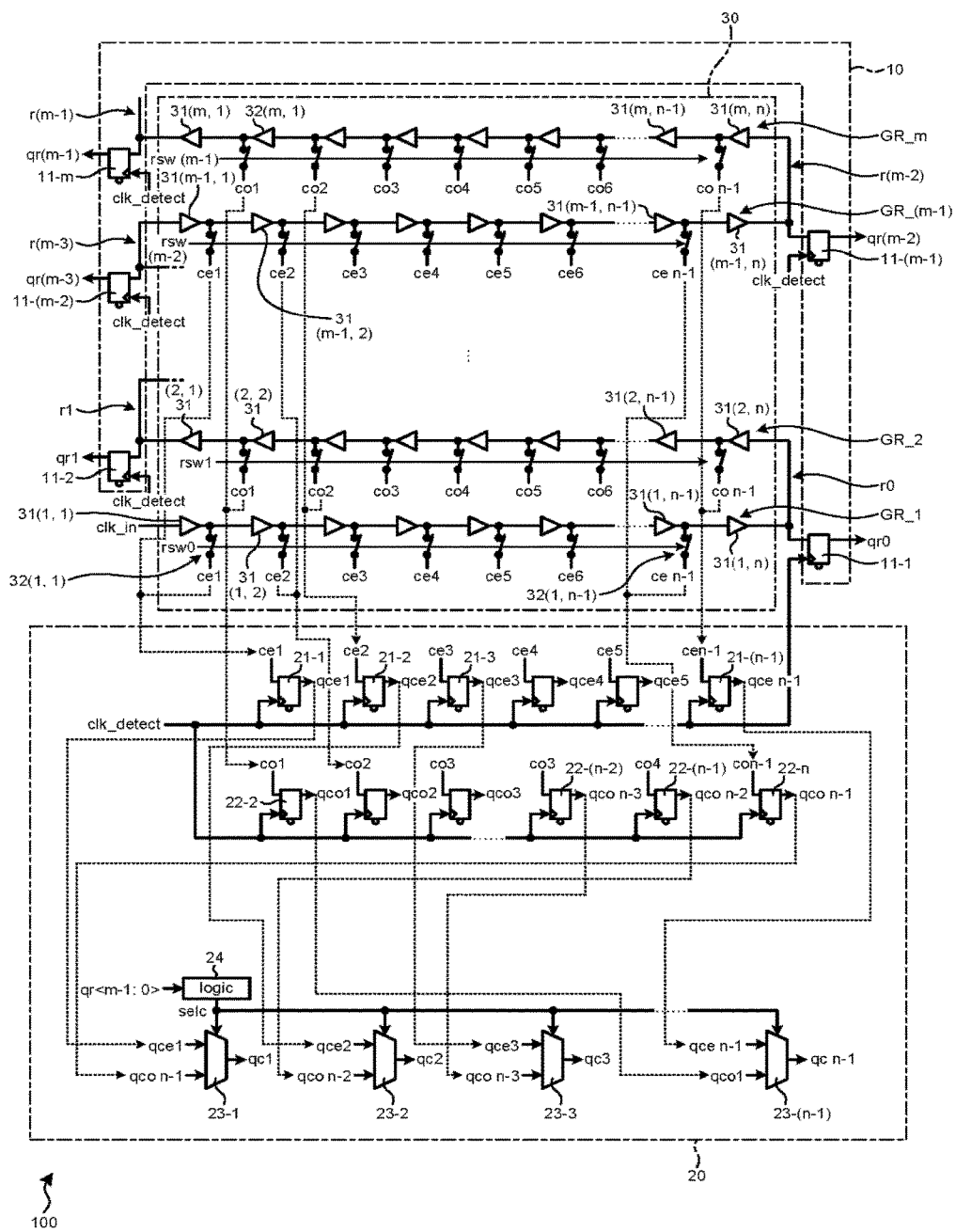
FIG. 3 is a circuit diagram illustrating a configuration of the semiconductor integrated circuit according to the first embodiment.

Specifically, the semiconductor integrated circuit 100 can be configured as illustrated in FIG. 3. FIG. 3 is a circuit diagram illustrating a configuration of the semiconductor integrated circuit 100. The semiconductor integrated circuit 100 includes a delay chain 30, a detection circuit (first detection circuit) 10, and a detection circuit (second detection circuit) 20.

In the delay chain 30, the plurality of delay elements are arranged in a matrix shape, and the plurality of delay elements are grouped into a plurality of groups. If m and n are set to arbitrary integers of 2 or more, the delay chain 30 may include m rows and n columns of the delay elements 31(1, 1) to 31(m, n). In FIG. 3, a configuration in a case where m is an even number is exemplified. Each of the delay elements 31(1, 1) to 31(m, n) has equal delay characteristics (for example, an equal certain delay amount D). The propagation direction of the reference clock clk_ref is the direction from the first column to the n-th column in the odd-numbered row and the direction from the n-th column to the first column in the even-numbered row. The output nodes of the delay elements in the n-th column in the odd-numbered row are connected to the input nodes of the delay elements in the n-th column in the even-numbered row with the row number being incremented. The output nodes of the delay elements in the first column in the even-numbered row are connected to the input node of the delay element in the first column of the odd-numbered row with the row number being incremented. As a result, each of the delay elements 31(1, 1) to 31(m, n) generates clocks having different delay amounts with respect to the reference clock clk_ref.

The plurality of groups GR_1 to GR_m are obtained by dividing the delay chain 30 in units of a row. In the delay chain 30, the plurality of groups GR_1 to GR_m are connected in series in a line shape and are arranged in a direction along the columns. The plurality of groups GR_1 to GR_m correspond to 1 to m rows in the array of the delay elements 31(1, 1) to 31(m, n). Each of the group GR_1 to GR_m includes the plurality of delay elements included in a corresponding row.

The delay chain 30 includes a plurality of switches 32(1, 1) to 32(m, n−1) in addition to the plurality of delay elements 31(1, 1) to 31(m, n). The plurality of switches 32(1, 1) to 32(m, n−1) are arranged in a matrix shape and correspond to the plurality of delay elements.

If 'k' is set to an arbitrary integer of 1 or more, a plurality of switches 32(2k−1, 1) to 32(2k−1, n−1) in the odd-numbered row correspond to the delay elements 31(2k−1, 1) to 31(2k−1, n−1) excluding the delay elements in the n-th column in the group GR_(2k−1) in the odd-numbered row. The plurality of switches 32(2k−1, 1) to 32(2k−1, n−1) in the same odd-numbered row are controlled to switch on/off by a common control signal rsw(2k−2).

Figure 4A:
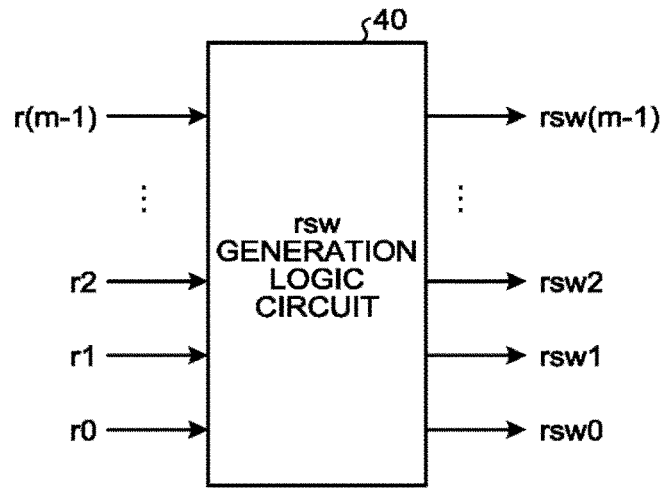
FIGS. 4A to 4C are circuit diagrams illustrating a configuration of an rsw generation logic circuit in the first embodiment.
Figure 4B:
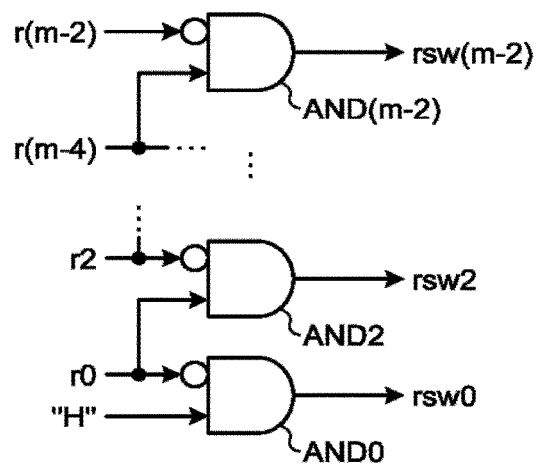
Figure 4C:
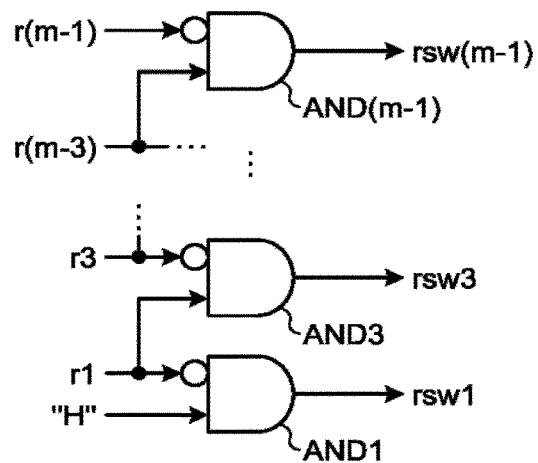

The control signal rsw(2k−2) is generated by an rsw generation logic circuit 40 illustrated in FIG. 4A. FIGS. 4A to 4C are diagrams illustrating a configuration of the rsw generation logic circuit 40. The rsw generation logic circuit 40 generates a control signal rsw(2k−2) for the switches 32(2k−1, 1) to 32(2k−1, n−1) in the odd-numbered row with a logic circuit illustrated in FIG. 4B. For example, the AND gate AND0 calculates a logical product of a high level fixed "H" signal and a signal obtained by logically inverting the output r0 of the last-stage delay element 31(1, n) in the first row and outputs the calculation result as rsw0. The AND gate AND2 calculates a logical product of the output r0 of the last-stage delay element 31(1, n) in the first row and a signal obtained by logically inverting the output r2 of the last-stage delay element 31(3, n) in the third row and outputs the calculation result as rsw 2 . . . . The AND gate AND(m−2) calculates a logical product of the outputs r(m−4) of the last-stage delay elements 31(m−3, n) in the (m−3)-th row and a signal obtained by logically inverting the output r(m−2) of the last-stage delay element 31(m−1, n) in the (m−1)-th row and outputs the calculation result as rsw(m−2).

The plurality of switches 32(2k, 1) to 32(2k, n−1) in the even-numbered row illustrated in FIG. 3 correspond to the plurality of delay elements 31(2k, 2) to 31(2k, n) excluding the delay elements in the first column in the group GR_2k in the even-numbered row. The plurality of switches 32(2k, 1) to 32(2k, n−1) in the same even-numbered row are controlled to switch on/off by a common control signal rsw(2k−1).

The control signal rsw(2k−1) is generated by the rsw generation logic circuit 40 illustrated in FIG. 4A. The rsw generation logic circuit 40 generates the control signal rsw(2k−1) for the switches 32(2k, 1) to 32(2k, n−1) in the even-numbered row by the logic circuit illustrated in FIG. 4C. For example, the AND gate AND1 calculates a logical product of a high level fixed "H" signal and a signal obtained by logically inverting the output r1 of the last-stage delay element 31(2, 1) in the second row and outputs the calculation result as rsw1. The AND gate AND3 calculates a logical product of the output r1 of the last-stage delay element 31(2, 1) in the second row and a signal obtained by logically inverting the output r3 of the last-stage delay element 31(4, 1) in the fourth row and outputs the calculation result as rsw3 . . . . The AND gate AND(m−1) calculates a logical product of the output r(m−3) of the last-stage delay element 31(m−2, 1) in the (m−2)-th row and a signal obtained by logically inverting the output r(m−1) of the last-stage delay element 31(m, 1) in the m-th row and outputs the calculation result as rsw(m−1).

The detection circuit 10 illustrated in FIG. 3 detects a group corresponding to a certain delay amount (for example, one cycle of the reference clock clk_ref) out of the plurality of groups GR_1 to GR_m. The detection circuit 10 includes a plurality of phase comparators (a plurality of first phase comparators) 11-1 to 11-m corresponding to the plurality of groups GR_1 to GR_m. The plurality of phase comparators 11-1 to 11-m correspond to 1 to m rows in the array of the delay elements 31(1, 1) to 31(m, n).

The phase comparators 11-(2k−1) (k is an arbitrary integer of 1 or more) corresponding to the odd-numbered rows compare the phase of the clock generated by the delay element in the n-th column in the group GR_(2k−1) of the corresponding row with the clock clk_detect and outputs the comparison result qr(2k−2) to the control circuit 3 (refer to FIG. 1).

Each phase comparator 11-2k (k is an arbitrary integer of 1 or more) corresponding to an even-numbered row compares the phase of the clock generated by the delay element in the first column in the group GR_2k of the corresponding row with the clock clk_detect and outputs the comparison result qr(2k−1) to the control circuit 3 (refer to FIG. 1).

Each of the comparison result qr(2k−1) and qr(2k−2) can have one of binary values of '0' and '1'. The comparison result of '0' may indicate that the phase of the clock generated by the delay element lags behind the phase of the clock clk_detect. The comparison result of '1' may indicate that the phase of the clock generated by the delay element is synchronized with or advances the phase of the clock clk_detect.

The detection circuit 20 detects a delay element corresponding to a certain delay amount (for example, one cycle of the reference clock clk_ref) among the plurality of delay elements included in the group detected by the detection circuit 10. The detection circuit 20 includes a plurality of phase comparators corresponding to a plurality of columns of delay elements included in each row. The detection circuit 20 includes a plurality of phase comparators (a plurality of second phase comparators) 21-1 to 21-(n−1), a plurality of phase comparators (a plurality of second phase comparators) 22-2 to 22-n, a plurality of selectors 23-1 to 23-(n−1), and a logic circuit 24.

The plurality of phase comparators 21-1 to 21-(n−1) correspond to a plurality of columns of the delay elements in the odd-numbered row, and the input nodes thereof may be electrically connected to the output nodes of the plurality of delay elements 31(2k−1, 1) to 31(2k−1, n−1) in the group GR_(2k−1) in the odd-numbered row through the plurality of switches 32(2k−1, 1) to 32(2k−1, n−1) in the odd-numbered row. The input node of the phase comparator 21-1 is commonly connected to the output nodes of the delay elements 31 in the first column in each odd-numbered row through the switches 32 . . . . The input node of the phase comparator 21-(n−1) is commonly connected to the output nodes of the delay elements 31 in the (n−1)-th column in each odd-numbered row through the switches 32.

The plurality of phase comparators 22-2 to 22-n correspond to a plurality of columns of the delay elements in the even-numbered row, and the input nodes thereof may be electrically connected to the output nodes of the plurality of delay elements 31(2k, 2) to 31(2k, n) in the group GR_2k in the even-numbered row through the plurality of switches 32(2k, 1) to 32(2k, n−1) in the even-numbered row. The input node of the phase comparator 22-2 is commonly connected to the output nodes of the delay elements 31 in the second column in each odd-numbered row through the switches 32 . . . . The input node of the phase comparator 22-n is commonly connected to the output nodes of the delay elements 31 in the n-th column in each odd-numbered row through the switches 32.

The plurality of selectors 23-1 to 23-(n−1) select any one of comparison results of the plurality of phase comparators 21-1 to 21-(n−1) and comparison results of the plurality of phase comparators 22-2 to 22-n and output the selected comparison results as the detection results qc1 to qc(n−1). If 'k' is set to an arbitrary integer of 1 or more, the selector 23-k selects any one of a comparison result of the phase comparator 21-k and a comparison result of the phase comparator 22-(n−k+1) according to the select signal selc received from the logic circuit 24 and outputs the selected comparison result as a detection result qc(k).

The logic circuit 24 receives the comparison results qr<m−1:0> of the plurality of phase comparators 11-1 to 11-m and generates a select signal selc according to the comparison result qr<m−1:0> and supplies the select signals to the respective selectors 23-1 to 23-(n−1). In a case the rising edge of the clock clk_in passes is an odd numbered row (refer to FIG. 6A), the logic circuit 24 generates select signals selc for selecting the comparison results of the phase comparators 21-1 to 21-(n−1) (comparison results qce1 to qce(n−1) in the odd-numbered row) and supplies the select signals to the respective selectors 23-1 to 23-(n−1). In a case the rising edge of the clock clk_in passes is an even numbered row (refer to FIG. 6A), the logic circuit 24 generates select signals selc for selecting the comparison results of the phase comparators 22-2 to 22-n (comparison results pool to quo(n−1) in the even-numbered row) and supplies the select signals to the respective selectors 23-1 to 23-(n−1). In this manner, by switching the outputs of the plurality of delay elements arranged in the same column with the switches and connecting the outputs to the phase comparators 21-1 to 21-(n−1) and 22-2 to 22-n, the phase comparator can be commonly used for each column, and the number of uses can be reduced.

According to the circuit illustrated in FIG. 3, the number of delay elements is n (the number in the horizontal direction: the number of columns)×m (the number in the vertical direction: the number of rows). In a case where the phase comparator is provided for each delay element, n×m phase comparators are necessary, and in the circuit illustrated in FIG. 3, 2n+m phase comparators are used. For example, when n=16 and m=16, the number n×m=256 of phase comparators are needed in case where a phase comparator is provided for each delay element. On the other hand, in the circuit illustrated in FIG. 3, the number of phase comparators can be reduced to 2n+m=48, which is about ⅕ times.

Figure 5:
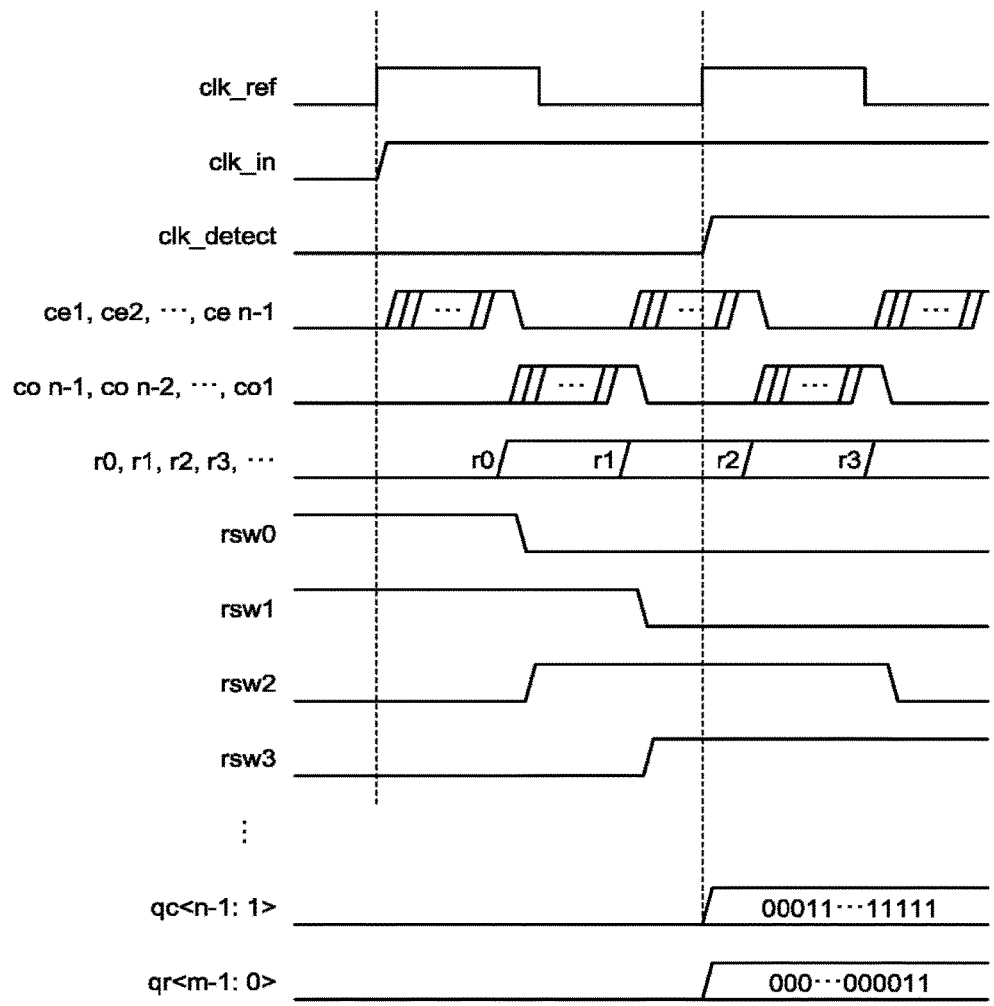
FIG. 5 is a waveform diagram illustrating operations of the semiconductor integrated circuit according to the first embodiment.

Next, a detection operation (delay time detection operation) of the number of delay element stages by the semiconductor integrated circuit 100 will be described with reference to FIG. 5. FIG. 5 is a waveform diagram illustrating the operation of the semiconductor integrated circuit 100.

The semiconductor integrated circuit 100 detects the number of delay element stages corresponding to a certain delay amount by using the clock clk_in and the clock clk_detect supplied from the clock generator 4. FIG. 5 illustrates a case where the certain delay amount is a delay time corresponding to one cycle of the reference clock clk_ref.

For example, when the clock clk_in is input to the delay chain 30, the rising edge of the clock clk_in sequentially passes through the delay elements in the delay chain 30, and the waveform of the outputs ce1, ce2, . . . , and ce(n−1) of the delay elements 31(1, 1) to 31(1, n−1) excluding the last stage in the first row sequentially rise. After that, the waveform of the output r0 of the delay element 31(1, n) of the last stage in the first row rises.

While the rising edge of the clock clk_in passes through the delay elements 31(1, 1) to 31(1, n) in the first row in this order, the control signal rsw0 is at the active level, and the switches 32(1, 1) to 32(1, n−1) in the first row are maintained in the ON state. The outputs ce1, ce2, . . . , and ce(n−1) of the delay elements 31(1, 1) to 31(1, n−1) in the first row are supplied to the corresponding phase comparators 21-1 to 21-(n−1). Since the rising edge of the clock clk_detect is not supplied to the phase comparators 21-1 to 21-(n−1), the phase comparators do not yet perform phase comparison. At this time, the control signal rsw1 of the switch of the second row is at the active level in order to smoothly perform switching of the first row to the second row. However, the control signals rsw2 to rsw(m−1) of the switches of the third row and the subsequent rows are at the non-active level.

While the rising edge of the clock clk_in passes through the delay elements 31(2, 1) to 31(2, n) in the second row in the reverse order, the control signal rsw1 is at the active level, and the switches 32(2, 1) to 32(2, n−1) in the second row are maintained in the ON state. The outputs co1, co2, . . . , and co(n−1) of the delay elements 31(2, 1) to 31(2, n−1) in the second row are supplied to the corresponding phase comparators 22-1 to 22-n. Since the rising edge of the clock clk_detect is not supplied to the phase comparators 22-1 to 22-n, the phase comparators do not yet perform phase comparison. At this time, the control signal rsw0 of the switch of the first row is at the non-active level according to the rising of the waveform of the output r0 of the last-stage delay element 31(1, n) in the first row, and the control signal rsw2 of the switch of the third row is changed from the non-active level to the active level in order to smoothly perform the switching of the second row to the third row. However, the control signals rsw3 to rsw(m−1) of the switches of the fourth row and the subsequent rows are at the non-active level.

While the rising edge of the clock clk_in passes through the delay elements 31(3, 1) to 31(3, n) in the third row in this order, the control signal rsw2 is at the active level and the switches 32(3, 1) to 32(3, n−1) in the third row are maintained in the ON state. The outputs ce1, ce2, . . . , and ce(n−1) of the delay elements 31(3, 1) to 31(3, n−1) in the third row are supplied to the corresponding phase comparators 21-1 to 21-(n−1). Until the rising edge of the clock clk_detect is supplied, the phase comparators 21-1 to 21-(n−1) do not perform phase comparison. At this time, the control signal rsw3 of the switch of the fourth row is at the active level in order to smoothly perform switching of the third row to the fourth row. However, the control signals rsw4 to rsw(m−1) of the switches of the fifth row and the subsequent rows are at the non-active level.

For example, the rising edge of the clock clk_detect is supplied while the rising edge of the clock clk_in passes through the delay elements 31(3, 1) to 31(3, n) of the third row. When the rising edge of the clock clk_detect is supplied, each of the phase comparators 11-1 to 11-m, the phase comparators 21-1 to 21-(n−1), and the phase comparators 22-2 to 22-n performs phase comparison and outputs the comparison result. The phase comparators 11-1 to 11-m output the comparison result qr<m−1:0> to the control circuit 3 as the detection result qr of the delay time detection circuit (refer to FIG. 1). The comparison results qce1 to qce(n−1) of the phase comparators 21-1 to 21-(n−1) and the comparison results qco1 to qco(n−1) of the phase comparators 22-2 to 22-n are supplied to the selectors 23-1 to 23-(n−1). In response to the fact that the row through which the rising edge of the clock clk_in passes is an odd numbered row (the third row), the selectors 23-1 to 23-(n−1) select the comparison results qce1 to qce(n−1) of an odd numbered row and output the comparison results to the control circuit 3 as the detection result qc of the delay time detection circuit 2 (refer to FIG. 1).

As a result, the delay time detection circuit 2 can output, to the control circuit 3, the detection results qr and qc indicating the number of delay element stages corresponding to the delay time of one cycle of the reference clock clk_ref. The contents of the detection results qr and qc are illustrated in, for example, FIGS. 6A and 6B. FIG. 6A is a diagram illustrating the detection result qr of the delay time detection circuit 2, and FIG. 6B is a diagram illustrating the detection result qc of the delay time detection circuit 2. The detection result qr is a bit pattern of m bits (for example, 8 bits in the case of m=8), and the detection result indicates, according to the bit pattern illustrated in FIG. 6A, which is the row of the group corresponding to the delay time of one cycle of the reference clock clk_ref. The detection result qc is a bit pattern of n−1 bits (7 bits in the case of n=8), and the detection result indicates, according to the bit pattern illustrated in FIG. 6B, which is the number of the delay element (which is the column of the delay element) in the group, which corresponds to the delay time of one cycle of the reference clock clk_ref.

That is, the semiconductor integrated circuit 100 can perform the detection of the number of delay element stages corresponding to the delay time of one cycle of the reference clock clk_ref by performing two stages of specifying the group (specifying which is the row) and specifying the element in the group (specifying which is the column of the delay element) and output the detection results qr and qc.

Receiving the detection results qr and qc as illustrated in FIGS. 6A and 6B, the logic circuit 5 (refer to FIG. 1) of the control circuit 3 obtains the number of delay element stages corresponding to the delay time of one cycle of the reference clock clk_ref. In the propagation order of the delay elements: 31(1, 1) to 31(1, n) (in ascending order of column numbers)→31(2, n) to 31(2, 1) (in descending order of column numbers)→31(3, 1) to 31(3, n) (ascending order of column numbers)→31(m−1, 1) to 31(m−1, n) (ascending order of column numbers)→31(m, n) to 31(m, 1) (in descending order of column numbers), the logic circuit 5 counts the number of delay element stages from the leading delay element to the detection results qr and qc (which corresponding to row number and column number) and sets the count result as the number of delay element stages corresponding to the delay time of one cycle of the reference clock clk_ref. The logic circuit 5 generates a select signal sel for selecting the output of the delay element adopted as the output clock clk_out according to the obtained number of delay element stages and outputs the select signal to the delay block 6.

Figure 7:
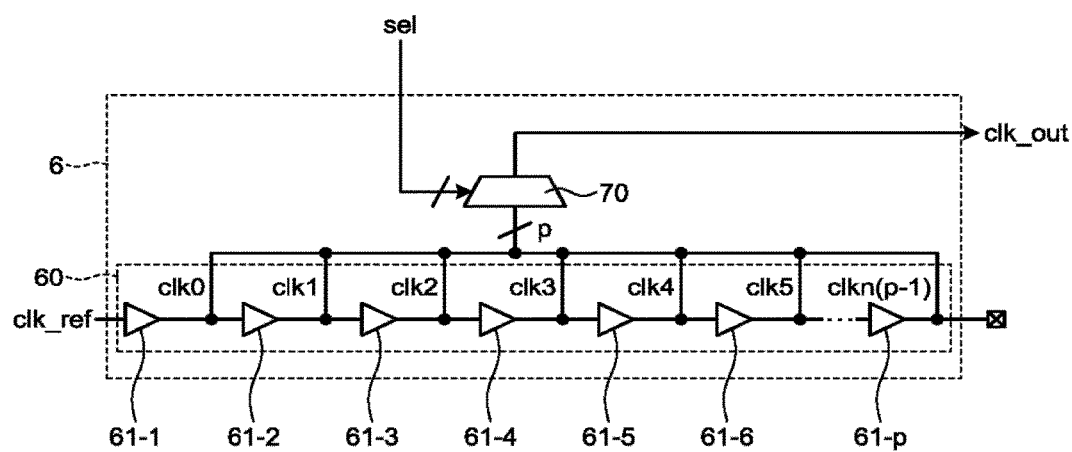
FIG. 7 is a circuit diagram illustrating a configuration of a delay block in the first embodiment.

The delay block 6 is configured, for example, as illustrated in FIG. 7. FIG. 7 is a diagram illustrating a configuration of the delay block 6. The delay block 6 includes a delay chain 60 and a selector 70. The delay chain 60 has a configuration where a plurality of delay elements 61-1 to 61-*p* (p is an arbitrary integer of 1 or more and m×n or less) are connected in series. Each of the delay elements 61-1 to 61-*p* has delay characteristics (for example, an equal delay amount D) equivalent to those of each of the delay elements 31(1, 1) to 31(*m*, *n*) in the delay chain 30 of the semiconductor integrated circuit 100.

Each of the delay elements 61-1 to 61-*p* in the delay chain 60 outputs, to the selector 70, the clocks clk0 to clk(p−1) delayed according to the number of stages from the leading delay element with respect to the reference clock clk_ref. For example, the delay element 61-*k* of the number k of delay element from the leading delay element (k is an arbitrary integer of 1 or more and p or less) outputs, to the selector 70, the clock clk(k−1) obtained by delaying the reference clock clk_ref by the delay amount D×k.

Figure 8:
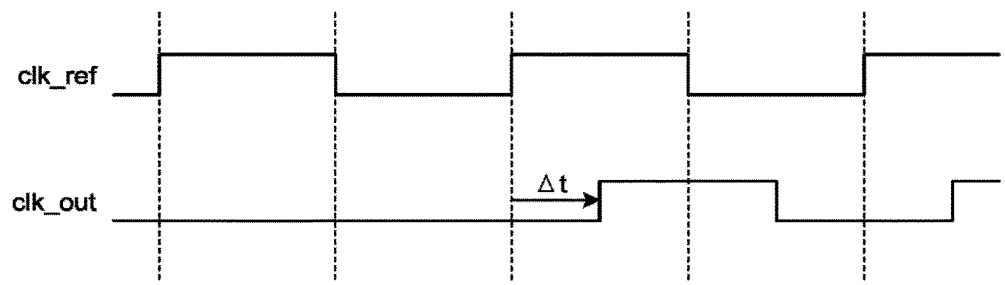
FIG. 8 is a waveform diagram illustrating operations of a DLL circuit including the semiconductor integrated circuit according to the first embodiment.

As illustrated in FIG. 8, until the select signal sel is supplied, the selector 70 does not operate and does not output the output clock clk_out. The selector 70 selects one of the plurality of clocks clk0 to clk(p−1) from the plurality of delay elements 61-1 to 61-*p* according to the select signal sel supplied from the logic circuit 5 and outputs the clock as an output clock clk_out having a desired delay amount Δt as illustrated in FIG. 8. FIG. 8 is a waveform diagram illustrating operations of the delay block 6 in the DLL circuit 1. The desired delay amount Δt corresponds to the required delay amount (delay time).

For example, in a case where the number of delay element stages corresponding to the delay time of one cycle of the reference clock clk_ref is 4×M and it is required to generate a clock obtained by delaying the reference clock clk_ref by ¼ cycle, the logic circuit 5 supplies, to the selector 70, a select signal sel for selecting the delay element 61-M among the plurality of delay elements 61-1 to 61-*p*. As a result, the selector 70 outputs the clock clk(M−1) output from the delay element 61-M as the output clock clk_out.

Alternatively, in a case where the number of delay element stages corresponding to the delay time of one cycle of the reference clock clk_ref is 4×M and it is required to generate a clock obtained by delaying the reference clock clk_ref by half cycle, the logic circuit 5 supplies, to the selector 70, a select signal sel for selecting the delay element 61-2×M among the plurality of delay elements 61-1 to 61-*p*. As a result, the selector 70 outputs the clock clk(2×M−1) output from the delay element 61-2×M as the output clock clk_out.

It should be noted that the DLL circuit 1 is provided with a delay chain 60 separately from the delay chain 30 used for the delay time detection operation and performs generation of the output clock clk_out. An advantage of separately providing the delay chain 60 for generating the output clock is that by reducing the number of elements attached to each delay element output, the load capacitance is reduced, and thus, the delay per stage of the delay element is reduced to increase resolution, so that it is possible to generate a more accurate delay. At this time, it is effective that the delay elements used for the delay generation circuit between the delay chain 30 and the delay chain 60 have a same circuit and same layout so as to reproduce the same delay.

As described above, in the first embodiment, in the semiconductor integrated circuit 100, a plurality of delay elements included in the delay chain 30 are grouped, and the detection of the number of delay element stages corresponding to a certain delay amount (delay amount of one cycle of the reference clock clk_ref) in the semiconductor integrated circuit 100 is performed by two stages of specifying the groups and specifying the elements in the group. As a result, since the number of phase comparators required for detecting the certain delay amount can be reduced, leakage current and power consumption of the DLL circuit 1 including the semiconductor integrated circuit 100 can be suppressed, and the layout area of the DLL circuit 1 can be reduced.

In addition, in the first embodiment, in the DLL circuit 1 including the semiconductor integrated circuit 100, it is possible to detect the number of delay stages with a certain delay amount in one cycle of the reference clock clk_ref and to perform locking to a desired delay amount. As a result, since the output clock clk_out can be generated at a high speed, the DLL circuit can contribute to increasing the speed of operation of a high-speed I/F circuit for which the DLL circuit 1 is used.

It should be noted that the arrangement of the delay chain 30 may be in a shape (for example, a shape similar to that of the delay chain 60) other than a matrix shape as long as the plurality of delay elements can be grouped.

Second Embodiment

Next, a semiconductor integrated circuit 200 according to a second embodiment will be described. Hereinafter, description will be made mainly on components different from those of the first embodiment.

In the first embodiment, the plurality of groups GR_1 to GR_m are connected in a line shape to constitute the delay chain 30. However, in the second embodiment, a plurality of groups GR_201 and GR_202 are connected in a loop shape to constitute a delay chain 230.

Specifically, the semiconductor integrated circuit 200 includes a delay chain 230, a detection circuit (first detection circuit) 210, and a detection circuit (second detection circuit) 220.

The delay chain 230 includes the plurality of delay elements, the plurality of delay elements are arranged in a matrix shape, and the plurality of delay elements are grouped into a plurality of groups (for example, two rows of groups). If 'n' is set to an arbitrary integer of 2 or more, the delay chain 230 may include two rows and n columns of the delay elements 231(1, 1) to 231(2, n).

The plurality of groups GR_201 and GR_202 are obtained by dividing the delay chain 230 in units of a row. In the delay chain 230, the plurality of groups GR_201 and GR_202 are connected in a loop shape and arranged in a direction along the rows. The output node of the delay element 231(1, n) in the n-th column in the group GR_201 in the first row is connected to the input node of the delay element **231(2, *n*) in the n-th column in the group GR_202 in the second row. The output node of the delay element 231(2, 1) of the first column in the group GR_202 of the second row is connected to the input node of the delay element 231(1, 1)** of the first column in the group GR_201 of the first row.

The delay chain 230 further includes a select signal generation circuit 232. The delay element 231(1, 1) in the first column in the group GR_201 functions as a delay element and also functions as a selector that performs selection operation according to the select signal s1 from the select signal generation circuit 232. As a result, at the timing when the rising edge of the clock clk_in is supplied, the delay element 231(1, 1) in the first column receives the clock clk_in, and in a period after a timing slightly delayed from the timing, the delay element delays the output of the delay element 231(2, 1) and outputs the delayed output to the next-stage delay elements 231(1, 2). That is, since the delay chain 230 switches the signal to be selected after receiving the rising edge (L→H) of the clock clk_in for the first time to the output co0 (L level) of the delay element 231(2, 1), the delay chain can generate a pulse, and the delay chain can propagate the generated pulse in a loop shape for a plurality of times in the delay chain 230.

It should be noted the delay element 231(1, 1) that can function as a selector and the other delay elements 231(1, 2) to 231(2, n) can have an equivalent configuration. For example, by configuring both with two stages of NANDs, both can have the function as a delay element and a selector with an equivalent configuration.

The detection circuit 210 includes a plurality of phase comparators 211-1 and 211-2. Each of the phase comparators 211-1 and 211-2 includes latch circuit 213-1 and 213-2 and counters 212-1 and 212-2. Each of the latch circuits 213-1 and 213-2 is, for example, a latch circuit (D latch circuit) of Low Enable. Each of the latch circuits propagates the input to the output in the period when the clock clk_detect is at the L level, and each of the latch circuits fixes the output signal when the clock clk_detect reaches the H level. Each of the counters 212-1 and 212-2 counts the number of loops in which signals are propagated to the delay chain 230 in a loop shape.

In the phase comparator 211-1 corresponding to the first row, in the period when the clock clk_detect is at the L level, the latch circuit 213-1 passes the pulse of the clock ce(n) generated by the delay element 231(1, n) of the n-th column in the group GR_201 of the first row and outputs the pulse of the passed clock ce(n) to the counter 212-1. The counter 212-1 increments the count value qrcnt0 at the timing when the pulse is supplied from the latch circuit 213-1 and outputs the incremented count value.

In the phase comparator 211-2 corresponding to the second row, in the period when the clock clk_detect is at the L level, the latch circuit 213-2 passes the pulse of the clock co1 generated by the delay element 231(2, 1) of the first column in the group GR_202 of the second row and outputs the pulse of the passed clock co1 to the counter 212-1. The counter 212-2 increments the count value qrcnt1 at the timing when the pulse is supplied from the latch circuit 213-2 and outputs the incremented count value.

The detection circuit 220 includes a logic circuit 224 instead of the logic circuit 24 (refer to FIG. 3). The logic circuit 224 receives the count values qrcnt0 and qrcnt1 of the counters 212-1 and 212-2, generates the select signals selc according to the count values qrcnt0 and qrcnt1, and supplies the select signals to the respective selectors 23-1 to 23-(n−1). In a case the rising edge of the clock clk_in passes is the first row (for example, in a case where qrcnt0>qrcnt1), according to the count values qrcnt0 and qrcnt1, the logic circuit 224 generates select signals selc for selecting the comparison results (comparison results qce1 to qce(n−1) of the first row) of the phase comparators 21-1 to 21-(n−1) and supplies the select signals to the respective selectors 23-1 to 23-(n−1). In a case the rising edge of the clock clk_in passes is the second row (for example, when qrcnt0=qrcnt1), according to the count values qrcnt0 and qrcnt1, the logic circuit 224 generates select signals selc for selecting the comparison results (comparison results qco1 to qco(n−1) of the second row) of the phase comparators 22-2 to 22-n and supplies the select signals to the respective selectors 23-1 to 23-(n−1).

Figure 9:
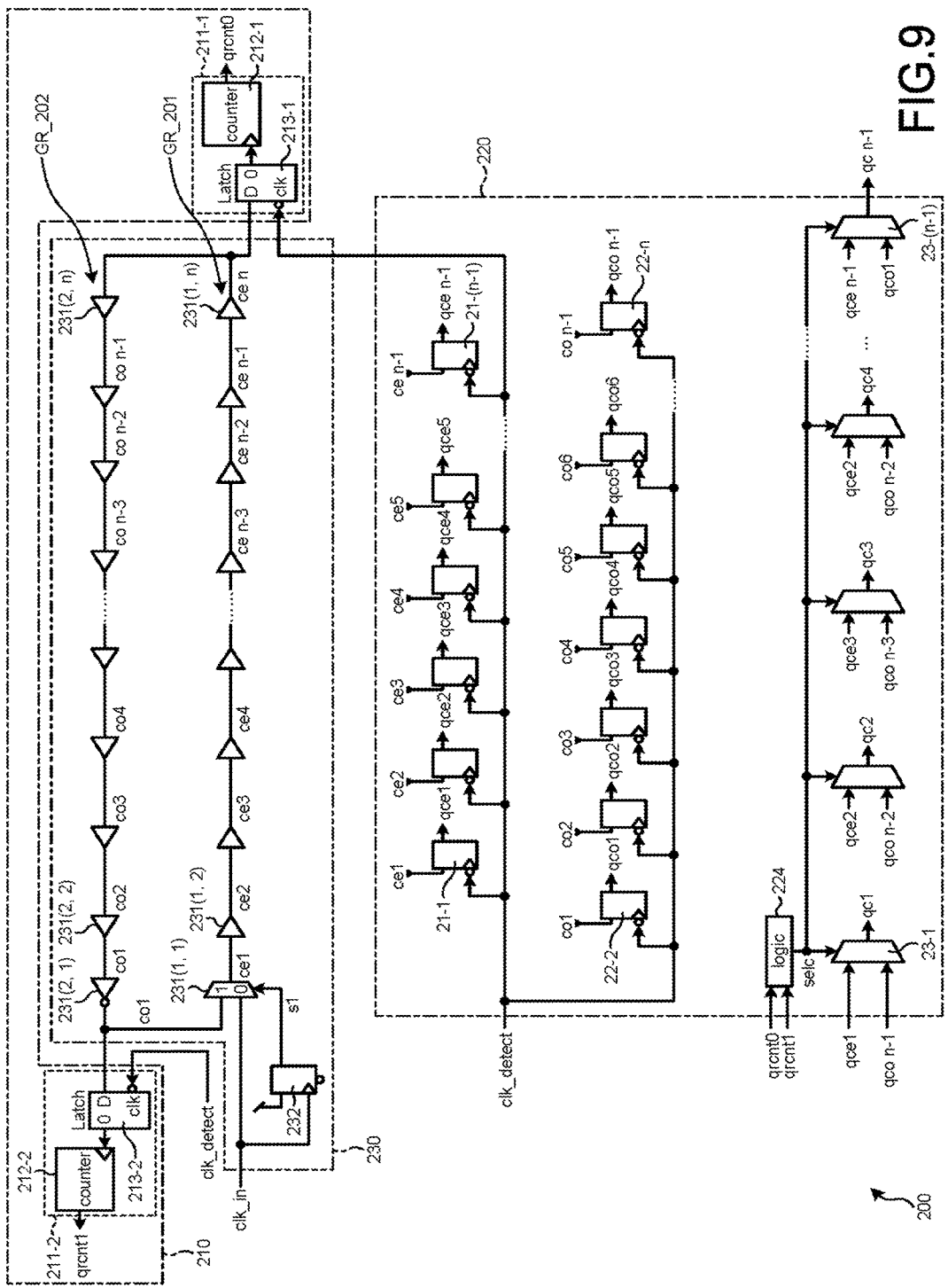
FIG. 9 is a circuit diagram illustrating a configuration of a semiconductor integrated circuit according to a second embodiment.

According to the circuit illustrated in FIG. 9, as compared with the first embodiment, by commonizing the groups of the odd-numbered rows to the group GR_201 of the first row and commonizing the groups of the even-numbered row to the group GR_202 of the second row, the number of delay elements used for the delay time detection operation and the number of phase comparators can be reduced. That is, as compared with the first embodiment, the number of delay elements in the delay chain 230 and the number of phase comparators in the detection circuit 210 can be reduced. FIG. 9 is a circuit diagram illustrating a configuration of the semiconductor integrated circuit 200.

Figure 10:
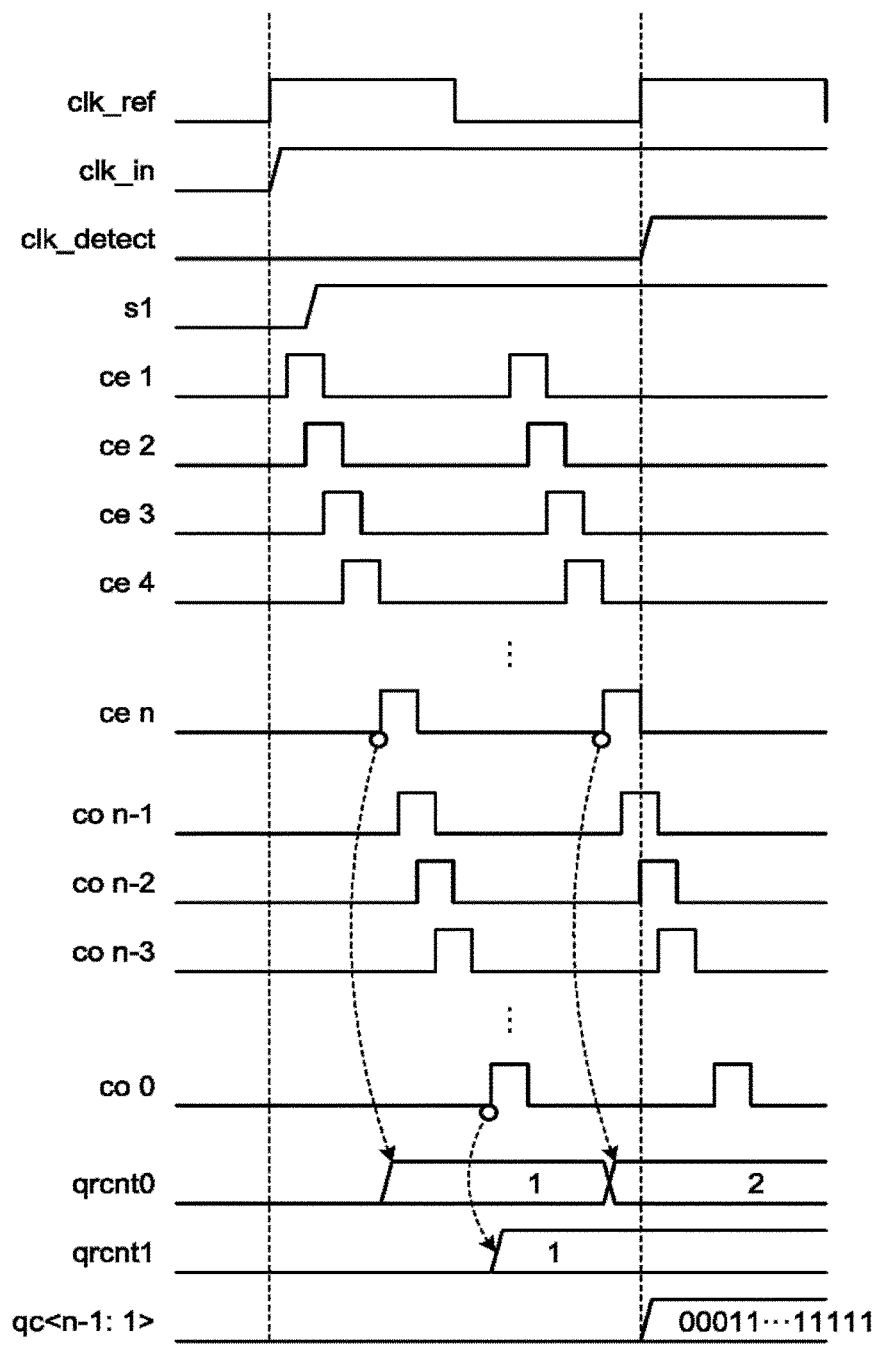
FIG. 10 is a waveform diagram illustrating operations of the semiconductor integrated circuit according to the second embodiment.

In addition, as illustrated in FIG. 10, the detection operation (delay time detection operation) of the number of delay element stages by the semiconductor integrated circuit 200 is different from that of the first embodiment in the following point. FIG. 10 is a waveform diagram illustrating operations of the semiconductor integrated circuit 200.

At the timing when the rising edge of the clock clk_in is supplied, the select signal generation circuit 232 supplies the select signal sl of "0" to the delay element 231(1, 1). The delay element 231(1, 1) selects the supply side (0 side) of the clock clk_in, delays the clock by the delay amount D, and outputs the delayed clock to the next-stage delay element 231(1, 2). The select signal generation circuit 232 transitions the select signal sl from "0" to "1" at a slightly delayed timing with respect to the rising edge of the clock clk_in, and thus, the delay element 231(1, 1) switches the signal to be selected to the output co0 (L level) of the delay element 231(2, 1). The waveform of the output ce1 of the delay element 231(1, 1) becomes a pulse-like waveform. After that, the select signal generation circuit 232 maintains the select signal sl to "1", and the delay element 231(1, 1) maintains the state where the output side (1 side) of the delay element 231(2, 1) is selected. As a result, as illustrated by the waveforms of ce1 to ce(n) and co(n−1) to co0, the pulses are circulated in the delay chain 230 where the plurality of groups GR_201 and GR_202 are connected in a loop shape.

While the clock clk_detect is at the L level, the circulating pulse advances the count values grcnt0 and qrcnt1 of the counters 212-1 and 212-2 at both ends of the delay chain 230.

When the clock clk_detect becomes H level, that is, when the rising edge of the clock clk_detect is supplied, updating of the count values qrcnt0 and qrcnt1 of the counters 212-1 and 212 is stopped. At this time, the counters 212-1 and 212-2 output the count values grcnt0 and qrcnt1 to the control circuit 3 as the detection results of the delay time detection circuit 2 (refer to FIG. 1).

Together with this, each of the phase comparators 21-1 to 21-(n−1) and the phase comparators 22-2 to 22-n performs phase comparison and outputs the comparison result. The comparison results qce1 to qce(n−1) of the phase comparators 21-1 to 21-(n−1) and the comparison results qco1 to qco(n−1) of the phase comparators 22-2 to 22-n are supplied to the selectors 23-1 to 23-(n−1). In the case of FIG. 10, qrcnt0>qrcnt1, and in response to the fact that the row through which the pulse currently passes is the first row, the selectors 23-1 to 23-(n−1) select the comparison results qce1 to qce(n−1) of the first row and outputs the comparison results to the control circuit 3 as the detection result qc of the delay time detection circuit 2 (refer to FIG. 1).

As a result, the delay time detection circuit 2 can output, to the control circuit 3, the detection results qrcnt0, qrcnt1, and qc indicating the number of delay element stages corresponding to the delay time of one cycle of the reference clock clk_ref. The contents of the detection results qrcnt0, qrcnt1, and qc are illustrated in, for example, FIGS. 11A and 11B. FIG. 11A is a diagram illustrating the detection results qrcnt0 and qrcnt1 of the delay time detection circuit 2, and FIG. 11B is a diagram illustrating the detection result qc of the delay time detection circuit 2. The detection results qrcnt0 and qrcnt1 are the count values of the two counters, and the detection results indicate, according to a combination of the two count values, which row of the group in a case of being converted into the group before communization is corresponding to the delay time of one cycle of the reference clock clk_ref. The detection result qc is a bit pattern of n−1 bits (7 bits in the case of n=8), and the detection results indicate, according to the bit pattern illustrated in FIG. 11B, which is the number of the delay element (which is the column of the delay element) in the group the delay element corresponding to the delay time of one cycle of the reference clock clk_ref. For example, in the qc, it is possible to search from the upper bit side of the qc and determine the column number with a bit changing from 0 to 1.

That is, the semiconductor integrated circuit 200 performs the detection of the number of delay element stages corresponding to the delay time of one cycle of the reference clock clk_ref by performing two stages of specifying the group (specifying which is the row of the group in the case of converting into the group before commonization) and specifying the element in the group (specifying which is the column of the delay element in the row) and can output the detection results qrcnt0, qrcnt1, and qc.

As described above, in the second embodiment, a plurality of groups GR_201 and GR_202 are connected in a loop shape to constitute a delay chain 230. A group corresponding to a certain delay amount is specified by a phase comparator and a counter (ripple counter) provided at both ends of the delay chain 230. As a result, the number of phase comparators used for the delay time detection operation can be reduced to 2(n+1), and the number of delay elements in the delay chain 230 can also be greatly reduced. Therefore, it is possible to increase the effect of reducing leakage and the effect of reducing the area.

Third Embodiment

Next, a semiconductor integrated circuit 100 according to a third embodiment will be described. Hereinafter, differences from the first embodiment will be mainly described.

In the first embodiment, a case where the semiconductor integrated circuit 100 is applied to the DLL circuit 1 is exemplified, but in the third embodiment, a case where the semiconductor integrated circuit 100 is applied to a duty cycle correction circuit (DCC) 301 will be exemplified.

Figure 12:
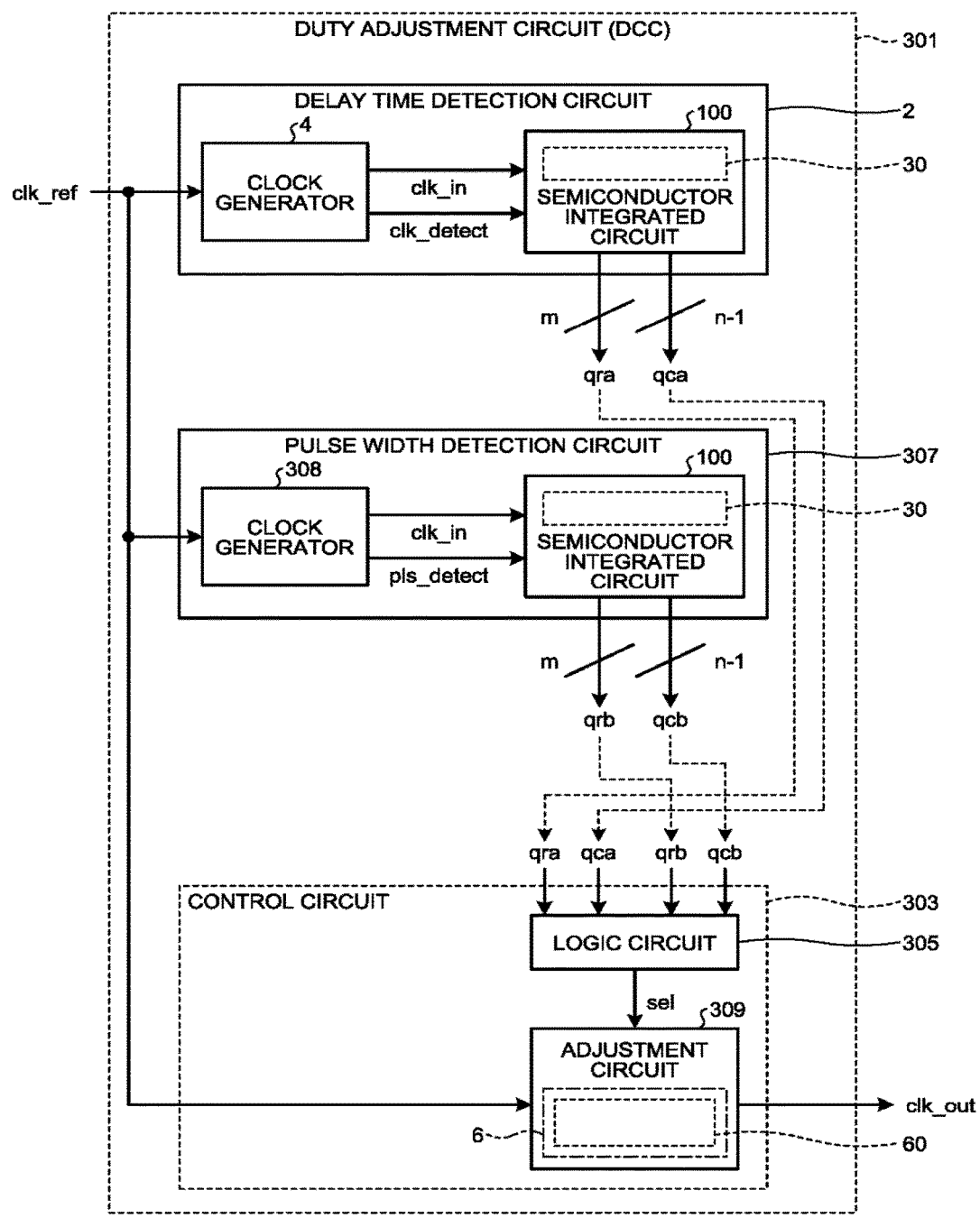
FIG. 12 is a block diagram illustrating a configuration of a duty cycle correction circuit including a semiconductor integrated circuit according to a third embodiment.

Specifically, the duty cycle correction circuit 301 may be configured as illustrated in FIG. 12. FIG. 12 is a diagram illustrating a configuration of the duty cycle correction circuit 301. The duty cycle correction circuit 301 includes a pulse width detection circuit 307 in addition to the delay time detection circuit 2 and includes a control circuit 303 instead of the control circuit 3 (refer to FIG. 1). Although the pulse width detection circuit 307 basically has the same configuration as the delay time detection circuit 2, a clock generator 308 is different from the clock generator of the first embodiment.

Figure 13:
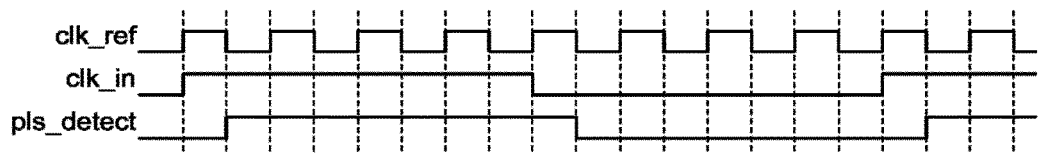
FIG. 13 is a waveform diagram illustrating operations of a clock generator in the third embodiment.

As illustrated in FIG. 13, the clock generator 308 generates a clock pls_detect for internal operation. FIG. 13 is a waveform diagram illustrating operations of the clock generator 308. In synchronization with the falling edge of the reference clock clk_ref, the clock generator 308 generates the clock pls_detect by delaying by the pulse width of the reference clock clk_ref. The clock pls_detect can be regarded as a clock for detecting a pulse width (time width of H level). The clock generator 308 supplies the clock clk_in and the clock pls_detect to the semiconductor integrated circuit 100 in the pulse width detection circuit 307.

The semiconductor integrated circuit 100 in the pulse width detection circuit 307 can perform the operation described in the description of the first embodiment in which the clock clk_detect is replaced with the clock pls_detect and output, to the control circuit 303, the detection results qrb and qcb indicating the number of delay element stages corresponding to the delay time corresponding to the pulse width of the reference clock clk_ref. The contents of the detection results qrb and qcb are the same as those illustrated in FIGS. 6A and 6B.

It should be noted that the delay time detection circuit 2 is the same as that of the first embodiment from the viewpoint that the delay time detection circuit can output, to the control circuit 303, the detection results qra and qca (similar to the detection results qr and qc) indicating the number of delay element stages corresponding to the delay time of one cycle of the reference clock clk_ref.

Receiving the detection results qra, qca, qrb, and qcb, the logic circuit 305 (refer to FIG. 12) of the control circuit 303 obtains the number of delay element stages corresponding to the delay time of one cycle of the reference clock clk_ref and obtains, based on the obtained number of delay element stages, the number of delay element stages for correcting a deviation from a target value (for example, 50%) of the duty ratio. The logic circuit 305 generates a select signal sol for selecting the output of the delay element adopted as the output clock clk_out according to the obtained number of delay element stages, and outputs the select signal to an adjustment circuit 309.

Figure 14:
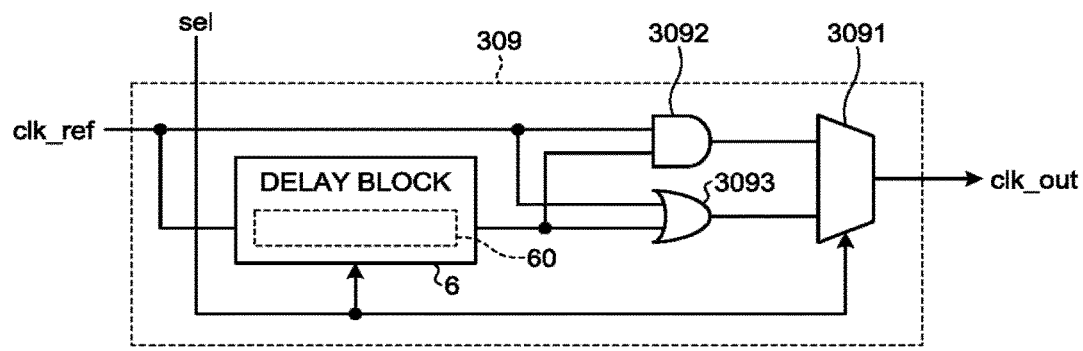
FIG. 14 is a circuit diagram illustrating a configuration of an adjustment circuit according to the third embodiment.

The adjustment circuit 309 is configured, for example, as illustrated in FIG. 14. FIG. 14 is a diagram illustrating a configuration of the adjustment circuit 309. The adjustment circuit 309 includes a selector 3091, an AND gate 3092, and an OR gate 3093 in addition to the delay block 6 (refer to FIG. 7). The select signal sel is supplied to each of the delay block 6 and the selector 3091. The AND gate 3092 calculates a logical product of the reference clock clk_ref and the output of the delay block 6, and outputs the calculation result to the selector 3091. The OR gate 3093 calculates a logical sum of the reference clock clk_ref and the output of the delay block 6 and outputs the calculation result to the selector 3091.

Figure 15:
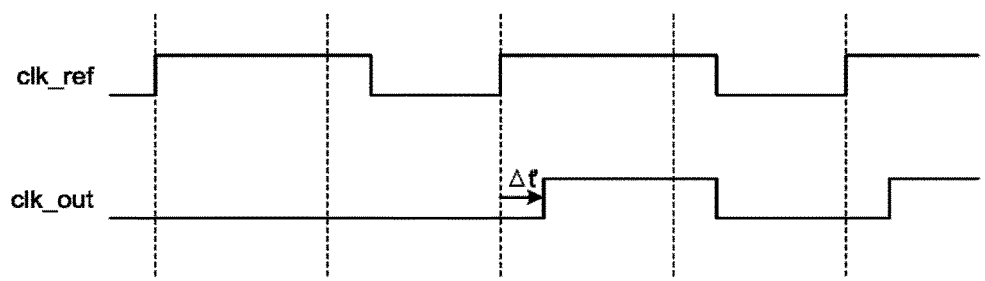
FIG. 15 is a waveform diagram illustrating operations of a duty cycle correction circuit including the semiconductor integrated circuit according to the third embodiment.

As illustrated in FIG. 15, until the select signal sel is supplied, the selector 3091 does not operate and does not output the output clock clk_out. According to the select signal sel supplied from the logic circuit 305, the selector 3091 selects the calculation result of the AND gate 3092 in the case of selectively delaying the rising edge of the reference clock clk_ref for duty ratio adjustment and selects the calculation result of the OR gate 3093 in the case of selectively delaying the falling edge of the reference clock clk_ref for duty ratio adjustment. In FIG. 15, a case where the selector 3091 selectively generates the output clock clk_out by delaying the rising edge of the reference clock clk_ref by a delay amount Δt' for duty ratio adjustment is exemplified.

As described above, in the third embodiment, the number of delay stages with a certain delay amount is detected in one cycle of the reference clock clk_ref, and the number of delay stages corresponding to a pulse width is detected, and thus, the duty ratio of the clock can be adjusted to the desired duty ratio. As a result, the duty ratio of the clock can be adjusted at a high speed.

It should be noted that the duty cycle correction circuit 301 may further include a duty detection circuit. For example, if the duty ratio is detected by feeding back the output clock clk_out output from the adjustment circuit 309 to the duty detection circuit, it is possible to determine the magnitude of the duty ratio in comparison with the target value. The logic circuit 305 may also determine the delay amount to be adjusted taking into consideration the detection result. As a result, the duty ratio can be adjusted according to dynamic fluctuation in the duty ratio of the reference clock clk_ref.

Alternatively, in the duty cycle correction circuit 301, the semiconductor integrated circuit 100 in at least one of the delay time detection circuit 2 and the pulse width detection circuit 307 may be replaced with the semiconductor integrated circuit 200.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a delay chain in which a plurality of delay elements are connected;
   a first detection circuit that detects a group corresponding to a certain delay amount among a plurality of groups obtained by dividing the delay chain; and
   a second detection circuit that detects a delay element corresponding to the certain delay amount among the plurality of delay elements included in the detected group,
   wherein the first detection circuit includes a plurality of first phase comparators corresponding to the plurality of groups, and
   wherein the second detection circuit includes a plurality of second phase comparators corresponding to the plurality of delay elements included in the detected group,
   the semiconductor integrated circuit further comprises a plurality of switches that selects any one of a plurality of corresponding delay elements over the plurality of groups, and connects the respective selected delay element to the respective second phase comparator corresponding to the each selected delay element.

2. The semiconductor integrated circuit according to claim 1,
   wherein the plurality of groups are connected in series, and
   wherein each of the plurality of first phase comparators is connected to an output node of a corresponding group, respectively.

3. A semiconductor integrated circuit comprising:
   a delay chain in which a plurality of delay elements are connected;
   a first detection circuit that detects a group corresponding to a certain delay amount among a plurality of groups obtained by dividing the delay chain; and
   a second detection circuit that detects a delay element corresponding to the certain delay amount among the plurality of delay elements included in the detected group,
   wherein the plurality of groups are connected in a loop shape,
   wherein the first detection circuit includes a plurality of first phase comparators each corresponding to the plurality of groups and a counter counting the number of times of loop of propagation signal in a loop shape in the delay chain, and
   wherein the second detection circuit includes a plurality of second phase comparators each corresponding to the plurality of delay elements included in the detected group.

4. The semiconductor integrated circuit according to claim 3, further comprising a plurality of switches that selects any one of a plurality of corresponding delay elements over the plurality of groups, and respectively connects the respective selected delay element to the respective second phase comparator corresponding to the each selected delay element.

5. The semiconductor integrated circuit according to claim 3, wherein
   one group in the plurality of groups includes a delay element configured to be capable of generating a pulse.

6. The semiconductor integrated circuit according to claim 1, wherein
   the certain delay amount is one cycle of a clock input to the delay chain.

7. A DLL circuit comprising:
   a semiconductor integrated circuit including
     a delay chain in which a plurality of delay elements are connected,
     a first detection circuit that detects a group corresponding to a certain delay amount among a plurality of groups obtained by dividing the delay chain, and
     a second detection circuit that detects a delay element corresponding to the certain delay amount among the plurality of delay elements included in the detected group,
     the semiconductor integrated circuit detecting the number of delay elements corresponding to one cycle of a first clock; and
   a control circuit including
     a second delay chain having a configuration equivalent to the delay chain in the semiconductor integrated circuit,
     the control circuit outputting a second clock obtained by delaying the first clock by using the second delay chain according to the number of delay elements detected by the semiconductor integrated circuit.

8. The DLL circuit according to claim 7,
   wherein the first detection circuit includes a plurality of first phase comparators corresponding to the plurality of groups, and
   wherein the second detection circuit includes a plurality of second phase comparators corresponding to the plurality of delay elements included in the detected group.

9. The DLL circuit according to claim 8, wherein
   the semiconductor integrated circuit further includes a plurality of switches that selects any one of a plurality of corresponding delay elements over the plurality of groups, and connects the respective selected delay element to the respective second phase comparator corresponding to the each selected delay element.

10. The DLL circuit according to claim 7,
wherein the plurality of groups are connected in a loop shape,
wherein the first detection circuit includes a plurality of first phase comparators each corresponding to the plurality of groups and a counter counting the number of times of loop of propagation signal in a loop shape in the delay chain, and
wherein the second detection circuit includes a plurality of second phase comparators each corresponding to the plurality of delay elements included in the detected group.

11. The DLL circuit according to claim 10, wherein
the semiconductor integrated circuit further includes a plurality of switches that selects any one of a plurality of corresponding delay elements over the plurality of groups, and connects the respective selected delay element to the respective second phase comparator corresponding to the each selected delay element.

12. The DLL circuit according to claim 7, wherein
the certain delay amount is one cycle of a clock input to the delay chain.

13. A duty cycle correction circuit comprising:
a first semiconductor integrated circuit having a first delay chain to which a plurality of delay elements are connected, and that detects the number of delay elements corresponding to one cycle of a first clock;
a second semiconductor integrated circuit that detects the number of delay elements corresponding to a time width of a first level of the first clock transitioning between the first level and a second level; and
a control circuit including a second delay chain having a configuration equivalent to the first delay chain in the first semiconductor integrated circuit, the control circuit delaying the first clock and outputting a second clock with duty being adjusted by using the second delay chain according to the number of delay elements detected by the first semiconductor integrated circuit and the number of delay elements detected by the second semiconductor integrated circuit,
wherein the first semiconductor integrated circuit includes:
  a first detection circuit that detects a first group corresponding to a certain first delay amount among a plurality of first groups obtained by dividing the first delay chain; and
  a second detection circuit that detects a delay element corresponding to the certain first delay amount among the plurality of delay elements included in the detected first group, and
wherein the second semiconductor integrated circuit includes:
  a third delay chain to which a plurality of delay elements are connected;
  a third detection circuit that detects a second group corresponding to a certain second delay amount among a plurality of second groups obtained by dividing the third delay chain; and
  a fourth detection circuit that detects a delay element corresponding to the certain second delay amount among the plurality of delay elements included in the detected second group.

14. The duty cycle correction circuit according to claim 13,
wherein the first detection circuit includes a plurality of first phase comparators corresponding to the plurality of first groups,
wherein the second detection circuit includes a plurality of second phase comparators corresponding to the plurality of delay elements included in the detected first group,
wherein the third detection circuit includes a plurality of third phase comparators corresponding to the plurality of second groups, and
wherein the fourth detection circuit includes a plurality of fourth phase comparators corresponding to the plurality of delay elements included in the detected second group.

15. The duty cycle correction circuit according to claim 14,
wherein the first semiconductor integrated circuit further includes a plurality of first switches that selects any one of a plurality of corresponding delay elements over the plurality of first groups, and connects the respective selected delay element to the respective second phase comparator corresponding to the each selected delay element, and
wherein the second semiconductor integrated circuit further includes a plurality of second switches that selects any one of a plurality of corresponding delay elements over the plurality of second groups, and connects the respective selected delay element to the respective fourth phase comparator corresponding to the each selected delay element.

16. The duty cycle correction circuit according to claim 13,
wherein the plurality of first groups are connected in a loop shape,
wherein the first detection circuit includes a plurality of first phase comparators each corresponding to the plurality of first groups and a first counter counting the number of times of loop of propagation signal in a loop shape in the first delay chain,
wherein the second detection circuit includes a plurality of second phase comparators each corresponding to the plurality of delay elements included in the detected first group,
wherein the plurality of second groups are connected in a loop shape,
wherein the third detection circuit includes a plurality of third phase comparators each corresponding to the plurality of second groups and a second counter counting the number of times of loop of propagation signal in a loop shape in the second delay chain, and
wherein the fourth detection circuit includes a plurality of fourth phase comparators each corresponding to the plurality of delay elements included in the detected second group.

17. The duty cycle correction circuit according to claim 16,
wherein the first semiconductor integrated circuit further includes a plurality of first switches that selects any one of a plurality of corresponding delay elements over the plurality of first groups, and connects the respective selected delay element to the respective second phase comparator corresponding to the each selected delay element, and
wherein the second semiconductor integrated circuit further includes a plurality of second switches that selects any one of a plurality of corresponding delay elements over the plurality of second groups, and connects the respective selected delay element to the respective fourth phase comparator corresponding to the each selected delay element.

18. The duty cycle correction circuit according to claim 13,
wherein the certain first delay amount is one cycle of the first clock input to the first delay chain, and
wherein the certain second delay amount is a half cycle of the second clock input to the second delay chain.

* * * * *